(12) United States Patent
Park et al.

(10) Patent No.: US 9,306,193 B2
(45) Date of Patent: Apr. 5, 2016

(54) ORGANIC ELECTROLUMINESCENT DISPLAY DEVICE AND METHOD OF MANUFACTURING THE SAME

(71) Applicant: Samsung Display Co., Ltd., Yongin-si (KR)

(72) Inventors: Jin-Woo Park, Yongin-si (KR); Jong-Hyuk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 150 days.

(21) Appl. No.: 14/161,405

(22) Filed: Jan. 22, 2014

(65) Prior Publication Data

US 2014/0134772 A1   May 15, 2014

Related U.S. Application Data

(62) Division of application No. 11/934,577, filed on Nov. 2, 2007, now Pat. No. 8,652,566, which is a division of application No. 10/729,989, filed on Dec. 9, 2003, now abandoned.

(30) Foreign Application Priority Data

Apr. 12, 2003  (KR) .................. 10-2003-0023219

(51) Int. Cl.
*H01L 51/00* (2006.01)
*H01L 51/56* (2006.01)
*H01L 51/52* (2006.01)

(52) U.S. Cl.
CPC ............ *H01L 51/56* (2013.01); *H01L 51/5237* (2013.01); *H01L 2251/5315* (2013.01)

(58) Field of Classification Search
None
See application file for complete search history.

(56) References Cited

U.S. PATENT DOCUMENTS

| 4,402,927 | A | | 9/1983 | von Dardel et al. |
| 5,124,204 | A | | 6/1992 | Yamashita et al. |
| 5,321,102 | A | * | 6/1994 | Loy et al. ............. 525/474 |
| 5,689,151 | A | | 11/1997 | Wallace et al. |
| 5,746,992 | A | | 5/1998 | Yoldas et al. |
| 5,757,126 | A | | 5/1998 | Harvey, III et al. |

(Continued)

FOREIGN PATENT DOCUMENTS

| CN | 2384314 | 6/2000 |
| CN | 1383351 | 12/2002 |

(Continued)

OTHER PUBLICATIONS

Chinese Office Action mailed Mar. 28, 2008.
Non-Final Office Action issued on Jul. 20, 2009 in U.S. Appl. No. 11/934,577.
Final Office Action issued on Dec. 29, 2009 in U.S. Appl. No. 11/934,577.
Notice of Allowance issued on Oct. 28, 2013 in U.S. Appl. No. 11/934,577.
Non-Final Office Action issued on Mar. 20, 2006 in U.S. Appl. No. 10/729,989.

(Continued)

*Primary Examiner* — Robert Vetere
(74) *Attorney, Agent, or Firm* — H.C. Park & Associates, PLC (57) ABSTRACT

An organic electroluminescent (EL) display device and a method of manufacturing the same are provided. The organic electroluminescent display device includes a rear substrate, a organic EL portion formed on one surface of the rear substrate with a first electrode, an organic layer and a second electrode sequentially laminated. The front substrate is coupled to the rear substrate to seal an internal space in which the organic EL portion is accommodated, for isolating the organic EL portion from the outside. The front substrate further has a transparent moisture-absorbing layer coated on its internal surface.

15 Claims, 6 Drawing Sheets

(56) References Cited

U.S. PATENT DOCUMENTS

| | | | |
|---|---|---|---|
| 6,215,241 B1* | 4/2001 | Haven et al. | 313/495 |
| 6,329,017 B1* | 12/2001 | Liu et al. | 427/240 |
| 6,355,125 B1 | 3/2002 | Tahon et al. | |
| 6,709,806 B2 | 3/2004 | Hotta et al. | |
| 6,737,176 B1* | 5/2004 | Otsuki et al. | 428/690 |
| 6,762,553 B1 | 7/2004 | Yokogawa et al. | |
| 6,770,502 B2* | 8/2004 | Cok et al. | 438/40 |
| 6,790,381 B2* | 9/2004 | Tsuruoka | C07C 31/28 106/287.17 |
| 6,791,256 B2 | 9/2004 | Nishizawa et al. | |
| 6,803,127 B2 | 10/2004 | Su et al. | |
| 7,019,458 B2 | 3/2006 | Yoneda | |
| 7,178,927 B2* | 2/2007 | Seo | 362/84 |
| 7,186,613 B2* | 3/2007 | Kirner et al. | 438/240 |
| 2003/0095907 A1* | 5/2003 | Pinnavaia et al. | 423/335 |
| 2005/0031791 A1 | 2/2005 | Sasaki et al. | |

FOREIGN PATENT DOCUMENTS

| | | |
|---|---|---|
| JP | 9-148066 | 6/1997 |
| JP | 10-275679 | 10/1998 |
| JP | 5-335080 | 11/2007 |

OTHER PUBLICATIONS

Final Office Action issued on Aug. 31, 2006 in U.S. Appl. No. 10/729,989.

Non-Final Office Action issued on Feb. 6, 2007 in U.S. Appl. No. 10/729,989.

Final Office Action issued on Jul. 26, 2007 in U.S. Appl. No. 10/729,989.

* cited by examiner

ORGANIC ELECTROLUMINESCENT DISPLAY DEVICE AND METHOD OF MANUFACTURING THE SAME

CROSS REFERENCE TO RELATED APPLICATIONS

This application is a divisional of U.S. application Ser. No. 11/934,577, now U.S. Pat. No. 8,652,566, filed on Nov. 2, 2007, which is a divisional of prior application Ser. No. 10/729,989, filed Dec. 9, 2003, now abandoned, and claims priority to and the benefit of Korean Patent Application No. 10-2003-0023219, filed on Apr. 12, 2003, which are all hereby incorporated by reference for all purposes as if fully set forth herein.

BACKGROUND OF THE INVENTION

1. Field of the Invention

The present invention relates to an organic electroluminescent (EL) display device and a method of manufacturing the same, and more particularly, to an organic EL display device with an improved encapsulation structure, and a method of manufacturing the same.

2. Background of the Invention

Generally, organic EL display devices are self-luminescent display devices which emit light by electrically exciting a fluorescent organic compound. They can be operated with low voltage and made thin. In addition, organic EL display devices have advantages, such as a wide viewing angle and a fast response speed, that overcome some of the problems of liquid crystal displays. Accordingly, it is expected that organic EL display devices may be applied to next generation displays that can overcome some of the shortcomings of liquid crystal displays.

In such organic EL display devices, an organic layer is formed in a predetermined pattern on a substrate made of glass or other transparent insulators. Electrode layers are disposed above and below the organic layers. The organic layers are made of organic compounds.

In organic EL display devices having the above-described structure, when positive and negative voltages are applied to the electrodes, holes are moved from an electrode, to which a positive voltage is applied, to an emission layer via a hole transport layer. Electrons are moved from an electrode, to which a negative voltage is applied, to the emission layer via an electron transport layer. The electrons meet the holes in the emission layer, thereby generating excitons. The excitons make a transition from an excitation state to a ground state, thereby causing fluorescent molecules of the emission layer to emit light. As a result, an image is formed.

In the aforementioned organic EL display devices, moisture absorbed into the device may result in deterioration of device performance. Thus, organic EL display devices may require an encapsulation structure for preventing infiltration of moisture.

In conventional organic EL display devices, several encapsulation techniques have been proposed, including methods in which a metal can or a glass substrate is processed in is the form of a cap having a groove to which a powdered absorbent for absorbing moisture is applied. Alternatively a film of the absorbent is adhered using a double-sided tape. However, since applying the absorbent to the groove may be quite complicated, the material and processing costs may increase, and the overall thickness of the substrate may increase. In the case of a powdered absorbent, it cannot be used for a front emission type display device since the substrate used for encapsulation is opaque,. Meanwhile, in the case of a film-like absorbent, there is a limit to preventing the infiltration of moisture. Since the film-like absorbent may be easily damaged due to scratches or other external impacts during manufacture or use, high durability and reliability cannot be attained. Thus, the encapsulation structure using a film-like absorbent is not generally suitable for mass production of organic EL display devices.

Japanese Patent Laid-open Publication No. 9-148066 discloses an organic EL display device comprising a laminate in which organic luminescent material layers made of organic compounds are disposed between a pair of opposite electrodes and within a hermetic container for isolating the laminate from external air. A drying material is disposed in the hermetic container, wherein the drying material absorbs moisture so that the device maintains a solid state even as it absorbs moisture. Examples of the drying materials include alkali metal oxides, sulfuric salts and the like. Such an organic EL display device may become bulky due to the shape of a hermetic container. Also, even if the device is maintained at a solid state after absorption of the moisture, the device cannot be used for a front emission type display because of its opacity. Further, since the manufacturing process is complicated, the material cost and processing cost may increase.

Japanese Patent Laid-open Publication No. 5-335080 discloses a method of forming a protection film for an organic EL device. In the disclosed method, a shapeless silica is protection film is formed on an organic EL device having an electroluminescent material layer containing at least one kind of organic compound between positive and negative electrodes, at least one of which is a transparent electrode. In the disclosed organic EL device, the structure for preventing moisture infiltration from the outside is configured such that dense, shapeless silica is thickly coated on one electrode. However, while the structure cannot absorb moisture inherently existing in the device, it can protect the organic EL device from external moisture. Thus, when using shapeless silica as a protective film material, separate structure for absorbing inherent moisture may be further necessary.

SUMMARY OF THE INVENTION

An embodiment of the present invention provides an organic electroluminescent (EL) display device having absorbing structure by which a transparent state can be maintained so as to allow a front emission type display even after absorption of moisture. The present invention further provides a method of manufacturing the organic EL display device.

A further exemplary embodiment of the present invention provides an organic EL display device which can simplify the manufacturing process, thereby reducing material and processing costs.

According to an aspect of the present invention, there is provided an organic electroluminescent display device comprising a rear substrate, and an organic EL portion formed on one surface of the rear substrate having a first electrode, an organic layer and a second electrode sequentially laminated. The electroluminescent display device further comprises a front substrate coupled to the rear substrate to seal an internal space in which the organic EL portion is accommodated for isolating the organic EL portion from the outside, and a transparent is moisture-absorbing layer coated on an internal surface of the front substrate.

According to another aspect of the present invention, there is also provided an organic electroluminescent display device comprising a rear substrate, and an organic EL portion formed on one surface of the rear substrate having a first electrode, an organic layer and a second electrode sequentially laminated. The electroluminescent display device further comprises a front substrate coupled to the rear substrate to seal an internal space in which the organic EL portion is accommodated for isolating the organic EL portion from the outside, and a moisture-absorbing layer made of a porous silica layer with a plurality of absorption holes coated on an internal surface of the front substrate.

According to still another aspect of the present invention, there is also provided a method of manufacturing an organic electroluminescent display device comprising preparing a rear substrate having an organic electroluminescent portion, coating porous silica on the internal surface of a front substrate, coating a sealant on a portion outside the organic electroluminescent portion disposed on at least one of the rear substrate and the front substrate, and assembling the rear substrate and the front substrate.

According to still another aspect of the present invention, there is provided a method of manufacturing a plurality of organic electroluminescent display devices comprising preparing a rear substrate having a plurality of organic electroluminescent portions, coating porous silica on the internal surface of a front substrate, coating a sealant on portions outside the plurality of electroluminescent portions disposed on at least one of the rear substrate and the front substrate, assembling the rear substrate and the front substrate and forming a panel having a plurality of organic electroluminescent display devices, and cutting the panel to manufacture the plurality of organic electroluminescent display devices.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Reference will now be made in detail to exemplary embodiments of the present invention, examples of which are illustrated in the accompanying drawings.

Figure 1:
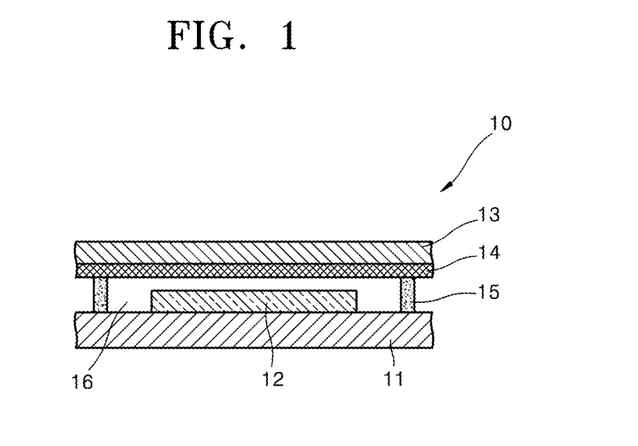
FIG. 1 is a cross-sectional view of an organic EL display device according to an embodiment of the present invention.

FIG. 1 is a cross-sectional view of an organic EL display device according to an embodiment of the present invention. Referring to FIG. 1, an organic EL display device 10 includes a rear substrate 11 made of glass or a transparent insulator, an organic EL portion 12 formed on one surface of the rear substrate 11 and having a first electrode, an organic layer and a second electrode sequentially laminated. A front substrate 13 is coupled to the rear substrate 11 to seal an internal space 16 in which the organic EL portion 12 is accommodated, for isolating the organic EL portion 12 from the outside. The front substrate 13 has a transparent moisture-absorbing layer 14 coated on its internal surface.

The organic EL portion 12 may be formed by sequentially depositing a first electrode, an organic layer and a second electrode, so that the first electrode serves as a positive electrode and the second electrode serves as a negative electrode. The organic layer may include at least an emission layer. Also, the organic EL portion 12 may include a first electrode as a positive electrode, a hole transport layer, an emission layer, an electron transport layer, and a second electrode as a negative electrode.

The front substrate 13 may be a glass substrate that is an insulator, a transparent plastic substrate or similar material. In the case of the transparent plastic substrate, a protection layer for protecting the plastic substrate against moisture may be formed on the internal or the outer surface of the plastic substrate. The protection layer may have heat resistance, chemical resistance and/or moisture permeation resistance.

For a rear emission type display, the first electrode of the organic EL portion 12 may be a transparent electrode, and the second electrode of the organic EL portion 12 may be a reflection-type electrode. For a front emission type display, the first electrode of the organic EL portion 12 may be a reflection-type electrode, and the second electrode of the organic EL portion 12 may be a transparent electrode. The first electrode is disposed near the rear substrate 11, and the second electrode is disposed near the front substrate 13.

In order to impart heat resistance, chemical resistance, and/or moisture permeation resistance, an inorganic protection layer 17 for planarizing the top surface of the organic EL portion 12 may be further provided on the second electrode. The protection layer 17 may be made of metal oxide, metal nitride or similar material.

The internal space 16, defined by the front substrate 13 and the rear substrate 11, may be made vacuous, or may be filled with an inert gas, e.g., neon, argon, or other gas capable of performing the same function as the inert gas. The front substrate 13 and the rear substrate 11 are generally coupled to each other using a sealant 15.

The moisture-absorbing layer 14 may be a porous silica layer. The porous silica layer may have a thickness in the range of about 100 nm to about 50 μm in view of manufacturing process and performance.

Figure 2:
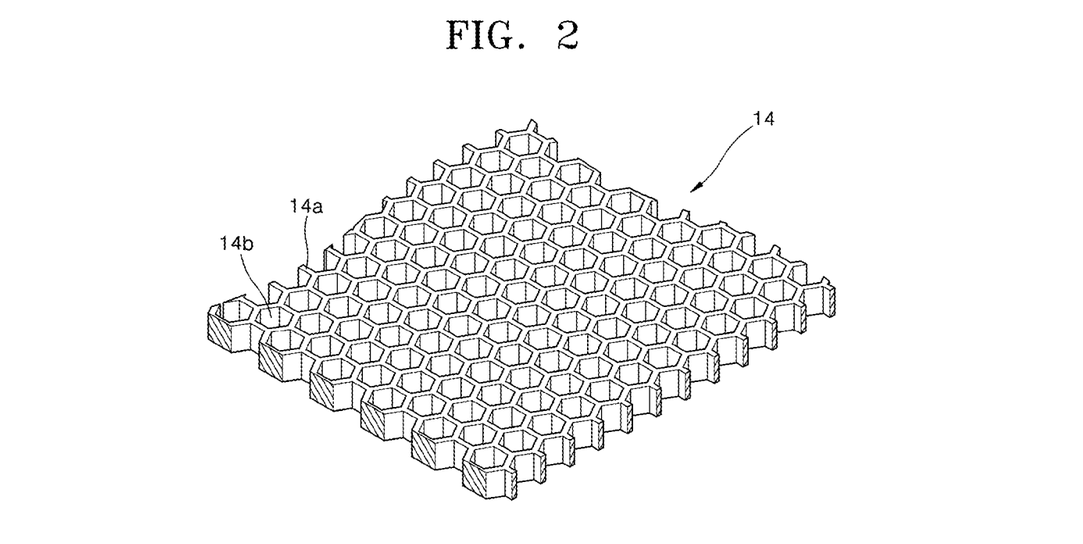
FIG. 2 is a cross-sectional view of a porous silica layer used in an organic EL display device according to an embodiment of the present invention.

FIG. 2 shows a porous silica layer used as a moisture-absorbing layer in the organic EL device according to an explemplary embodiment of the present invention. Referring to FIG. 2, the porous silica layer 14 includes a silica frame 14a and absorption holes 14b. The silica frame 14a props up the construction of the porous silica layer 14, and the absorption holes 14b absorb moisture. As described above, the porous silica layer 14 is maintained at a transparent state before and after absorption of moisture.

According to an exemplary embodiment of the invention, the porous silica layer 14 may be fabricated as follows. A first mixture of 0.3 g surfactant and 0.6 g solvent is prepared. Polymers may be used as the surfactant, and a mixed solvent of propanol and butanol in a ratio of 1:2, may be used as the solvent. A second mixture of 5 g TEOS (Tetra-Ethyl-Ortho-Silicate), 10.65 g solvent and 1.85 g HCL is then prepared.

The second mixture is stirred for approximately 1 hour. 2.1 g of the second mixture is mixed with the first mixture, forming a third mixture. The third mixture is coated on a substrate, such as a glass substrate, used as the front substrate.

Usable coating methods include spin coating, spray coating, roll coating and the like. The spin coating may be performed at 2000 rpm for 30 seconds. Next, the resulting structure is aged at room temperature for approximately 24 hours or at 40-50° C. for approximately 5 hours. In order to form absorption holes, firing is performed on the resulting structure at an oven maintained at approximately 400° C. for approximately 2 hours so that the polymer is burnt. The formed porous silica layer has a thickness of approximately 7000°. The above-described process is repeated, thereby forming a thin film having a thickness of approximately 3.5 μm. Values indicating the amount of materials as described above are only used to indicate the ratios thereof in the mixture, and it is recognized that specific values may be adjusted accordingly.

The thus-formed porous silica layer 14 includes large absorption holes 14b in its structure, as shown in FIG. 2. While each of the absorption holes 14b is generally 2-30 nm in diameter, the diameter may be adjusted by adjusting the size of the polymer used in the first mixture. The density of the absorption holes 14b formed in the porous silica layer 14 may be approximately 80% of the area (e.g. 80% of the area of the porous silica layer 14 is occupied by absorption holes 14b). As described above, the porous silica layer 14 may be formed by spin coating, spray coating, or roll coating, and may have high mechanical and thermal stability. Also, the formation process of the porous silica layer 14 may be relatively easily controlled.

Figure 3A:
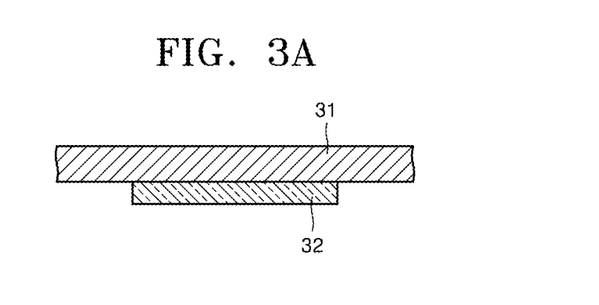
FIGS. 3A through 3D are cross-sectional views of steps in a method of manufacturing a single organic EL display device according to an embodiment of the present invention.
Figure 3B:
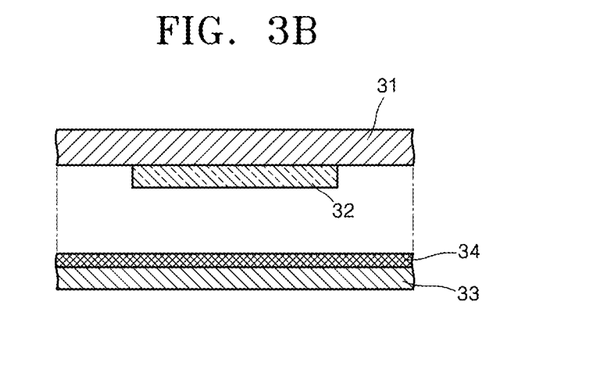
Figure 3C:
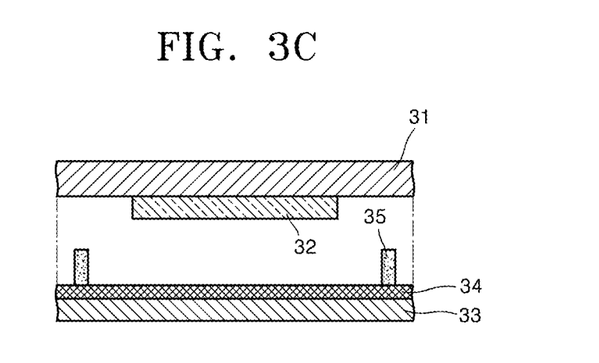
Figure 3D:
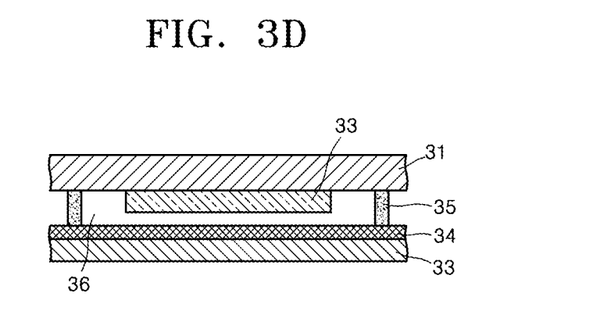

FIGS. 3A through 3D illustrate steps in a method of manufacturing a single organic EL display device according to an exemplary embodiment of the present invention. As is shown in FIG. 3A, a rear substrate 31 having an organic EL portion 32 is prepared. Then as described above, a porous silica layer 34 is coated on the inner surface of a front substrate 33, as shown in FIG. 3B. The front substrate 33 coated with the porous silica layer 34 is cleaned to remove foreign matter and organic material on its surface, and is left in a vacuous oven maintained at 150° C. for approximately 1 hour for desorption of moisture absorbed into the porous silica layer 34. Thereafter, a sealant 35 is coated outside the organic EL portion disposed on at least one of the rear substrate 31 and the front substrate 33, as shown in FIG. 3C, using a screen printer or a dispenser. As shown in FIG. 3D, the front substrate 33 and the rear substrate 31 are assembled in an assembly chamber.

In addition, an internal space 36 defined by the front and rear substrates of the thus-formed organic EL device may be made. Internal space 36 may be vacuous or filled with an inert gas. The sealant 35 may be cured using UV rays, visible light and/or heat after assembling the front substrate 33 and the rear substrate 31.

Figure 4A:
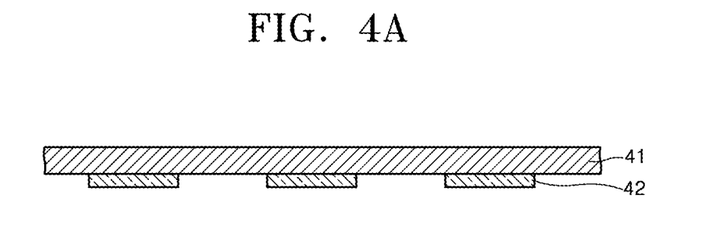
FIGS. 4A through 4E are cross-sectional views of steps in a method of manufacturing a plurality of organic EL display devices according to an embodiment of the present invention.
Figure 4B:
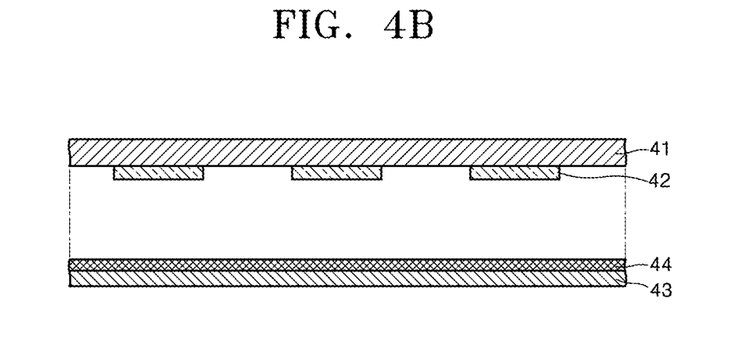
Figure 4C:
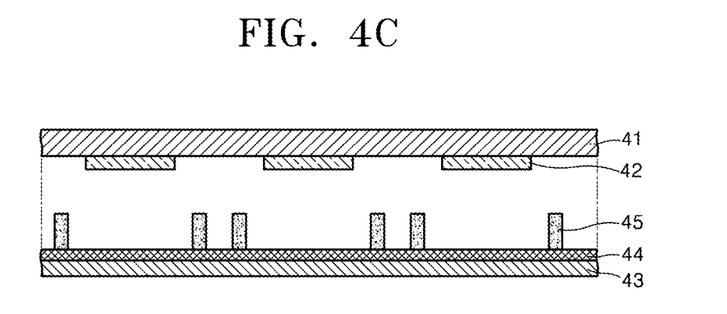
Figure 4D:
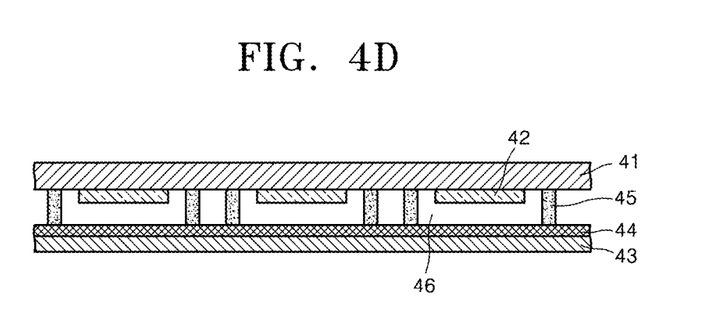
Figure 4E:
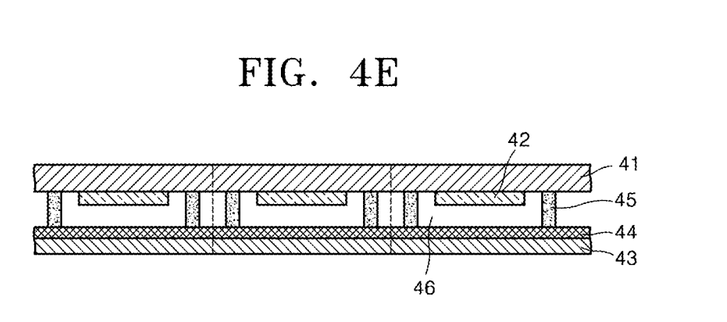

FIGS. 4A through 4E are cross-sectional views of steps in a method of manufacturing a plurality of organic EL display devices according to an exemplary embodiment of the invention. First, a rear substrate 41 having a plurality of organic EL portions 42 is prepared. A porous silica layer 44 is coated on the inner surface of a front substrate 43 by the above-described method, as shown in FIG. 4B. A sealant 45 is coated outside each of the plurality of organic EL portions disposed on at least one of the rear substrate 41 and the front substrate 43, as shown in FIG. 4C. The rear substrate 41 and the front substrate 43 are assembled to each other, as shown in FIG. 4D, forming a panel having a plurality of organic EL devices mounted thereon. The panel may then be cut, as shown in FIG. 4E, to provide individual organic EL devices. As with the manufacture of a single organic EL device, an internal space 46 is defined by the front and rear substrates 43 and 41 may be made. The internal space 46 may be vacuous or filled with an inert gas. The sealant 45 may be cured using UV rays, visible light and/or heat.

Figure 5:
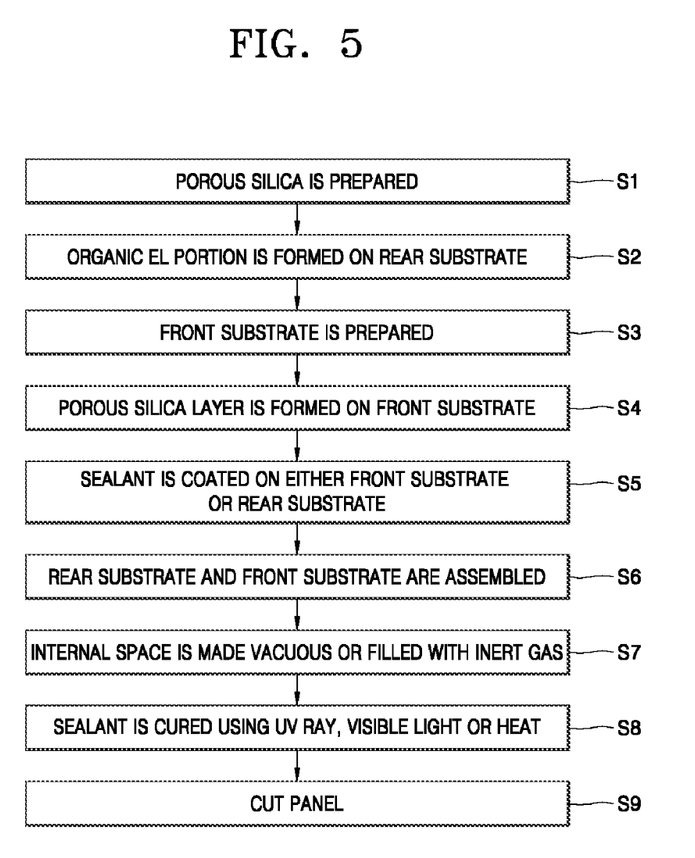
FIG. 5 is a flow diagram illustrating a method of manufacturing an organic EL display devices according to an embodiment of the present invention.

FIG. 5 is a flow diagram illustrating a method of manufacturing an organic EL display device according to an exemplary embodiment of the present invention.

Porous silica is prepared by the above-described method (step S1). An organic EL portion is formed on a rear substrate (step S2). A front substrate is prepared (step S3), and a porous silica layer is formed on the prepared front substrate (step S4). A sealant is coated on either the front substrate or the rear substrate (step S5). The rear substrate and the front substrate are assembled (step S6). An internal space defined by the front substrate and the rear substrate is made vacuous or filled with an inert gas (step S7). The sealant is cured using UV rays, visible light and/or heat (step S8). A panel having a plurality of organic EL devices is cut (step S9).

According to the present invention, a 3 cm by 4 cm sized, organic EL device having absorbing material of about 3.5 μm thickness may be produced. The absorbing material can absorb several to several tens of milligrams of moisture depending on the density of the absorbing material. The absorption level is not inferior to that of a typical desiccant, such as CaO or BaO, and the encapsulation effect can be ensured for approximately 30,000 to approximately 50,000 hours while maintaining the transparency of the substrate of the organic EL device having the absorbing material.

As described above, the organic EL device may have a transparent moisture-absorbing layer made of porous silica. According to an embodiment of the present invention, since the substrate used for encapsulation is transparent, it can be used for a front emission type display.

Also, as it is not necessary to form a separate groove in the front substrate to be used as an encapsulation substrate, the manufacturing process may be simplified, thereby reducing the processing cost and the material cost.

Figure 6:
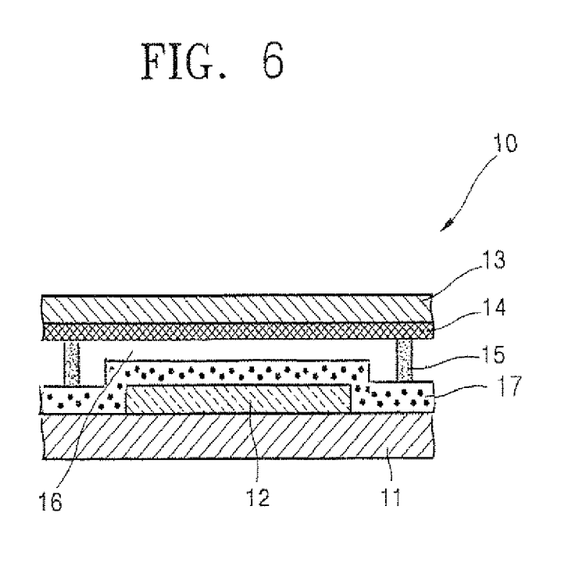
FIG. 6 is a cross-sectional view of an organic EL display device according to an exemplary embodiment of the present invention.

FIG. 6 is a cross-sectional view of an organic EL display device according to an exemplary embodiment of the present invention. Referring to FIG. 6, an inorganic protection layer 17 is disposed on the second electrode of the organic EL portion 12.

Further, since the front substrate is relatively thin, the overall volume of the organic EL display device is reduced, thereby achieving miniaturization of the organic EL device.

Although a few embodiments of the present invention have been shown and described, it will be appreciated by those of ordinary skill in the art that changes may be made in these elements without departing from the principles and spirit of the invention, the scope of which is defined in the appended claims and their equivalents.

What is claimed is:

1. A method of manufacturing an organic electroluminescent display device comprising:
    preparing a rear substrate having an organic electroluminescent portion;
    coating a mixture comprising polymer, silicate, and solvent on an internal surface of a front substrate;
    aging the mixture after coating;
    curing the mixture so that the polymer is burnt, such that the mixture is converted into a porous silica layer;
    coating a sealant on the porous silica layer and on a portion outside an organic electroluminescent portion disposed on at least one of the rear substrate and the front substrate;
    assembling the rear substrate and the front substrate, thereby forming a panel having an organic electroluminescent display device, wherein the porous silica layer covers the entire internal surface of the front substrate after assembling the front and rear substrates is completed.

2. The method of claim 1, further comprising curing the sealant.

3. The method of claim 1, further comprising one of making the internal space defined by the rear substrate and the front substrate vacuous, and filling the internal space with an inert gas.

4. The method of claim 3, further comprising curing the sealant.

5. The method of claim 1, further comprising forming the mixture by mixing a first mixture comprising the polymer and a first solvent with a second mixture comprising the silicate and a second solvent, the second solvent being different from the first solvent.

6. The method of claim 1, wherein the aging is performed at room temperature.

7. The method of claim 6, wherein the aging is performed for 24 hours.

8. The method of claim 1, wherein the aging is performed at 40° C. to 50° C.

9. The method of claim 8, wherein the aging is performed for 5 hours.

10. The method of claim 1, wherein the curing is performed at 400° C.

11. The method of claim 1, where the curing is performed for 2 hours.

12. The method of claim 1, wherein the silicate is tetra-ethyl-ortho-silicate.

13. The method of claim 1, wherein the porous silica layer has absorption holes, each of the absorption holes having a diameter of 2 to 30 nm.

14. The method of claim 1, wherein the porous silica layer has a thickness of 100 nm to 50 μm.

15. The method of claim 14, wherein the porous silica layer has a thickness of 3.5 μm.

* * * * *